(12) United States Patent
Chiu et al.

(10) Patent No.: US 10,634,717 B2
(45) Date of Patent: Apr. 28, 2020

(54) TESTING APPARATUS AND TESTING METHOD

(71) Applicant: Taiwan Semiconductor Manufacturing Co., Ltd., Hsinchu (TW)

(72) Inventors: Tang-Jung Chiu, Hsinchu (TW); Hung-Chih Lin, Hsinchu (TW); Mill-Jer Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 152 days.

(21) Appl. No.: 15/884,381

(22) Filed: Jan. 31, 2018

(65) Prior Publication Data

US 2019/0101589 A1    Apr. 4, 2019

Related U.S. Application Data

(60) Provisional application No. 62/565,121, filed on Sep. 29, 2017.

(51) Int. Cl.
| | |
|---|---|
| *G01R 31/28* | (2006.01) |
| *G01B 21/20* | (2006.01) |
| *G01B 21/08* | (2006.01) |
| *G01R 1/073* | (2006.01) |
| *G01B 11/24* | (2006.01) |

(52) U.S. Cl.
CPC ......... *G01R 31/2891* (2013.01); *G01B 21/08* (2013.01); *G01B 21/20* (2013.01); *G01R 1/07314* (2013.01); *G01R 31/2886* (2013.01); *G01R 31/2896* (2013.01); *G01B 11/24* (2013.01)

(58) Field of Classification Search
CPC ............ G01R 31/2891; G01R 31/2896; G01B 21/08; G01B 21/20; G01B 11/24; H01L 22/14
USPC ........................ 324/762.02, 762.01, 538, 537
See application file for complete search history.

(56) References Cited

U.S. PATENT DOCUMENTS

| | | | |
|---|---|---|---|
| 2007/0170948 A1* | 7/2007 | Chang ............... | G02F 1/136204 324/760.02 |
| 2009/0213288 A1* | 8/2009 | Chen .................... | G02F 1/1303 349/43 |
| 2011/0102694 A1* | 5/2011 | Cho ...................... | H01L 27/124 349/39 |

(Continued)

*Primary Examiner* — Giovanni Astacio-Oquendo
(74) *Attorney, Agent, or Firm* — JCIPRNET

(57) ABSTRACT

A testing apparatus for testing an integrated circuit package having a plurality of electrical terminals includes a base, a socket, a plurality of conductive pins and a plurality of conductive pillars. The base includes a plurality of electrical contacts. The socket is disposed on the base and includes a bended portion bended away from the base and a plurality of through holes distributed in the socket. The conductive pins are disposed in the through holes respectively and electrically connected to the electrical contacts, wherein each of the conductive pins protrudes from an upper surface of the socket for forming temporary electrical connections with one of the electrical terminals. The conductive pillars are disposed on the base and connected to the bended portion, wherein each of the conductive pillars electrically connects one of the conductive pins and one of the electrical contacts.

20 Claims, 6 Drawing Sheets

(56) References Cited

U.S. PATENT DOCUMENTS

2014/0167799 A1\* 6/2014 Wang ..................... H02H 9/046
  324/750.14
2018/0164343 A1\* 6/2018 Wang ................... H05K 1/0268
2018/0204828 A1\* 7/2018 Lu ....................... H01L 23/5386

\* cited by examiner

TESTING APPARATUS AND TESTING METHOD

CROSS-REFERENCE TO RELATED APPLICATION

This application claims the priority benefit of U.S. provisional application Ser. No. 62/565,121, filed on Sep. 29, 2017. The entirety of the above-mentioned patent application is hereby incorporated by reference herein and made a part of this specification.

BACKGROUND

With the evolving of semiconductor technologies, semiconductor dies are becoming increasingly smaller. However, more functions need to be integrated into the semiconductor dies. Accordingly, the semiconductor dies need to have increasingly greater numbers of I/O pads packed into smaller areas. As a result, the packaging of the semiconductor dies becomes more difficult, which adversely affects the yield.

To allow for more solder balls connected a die, fan-out wafer level chip scale package (WLCSP) was developed. In the fan-out WLCSP, dies are sawed from wafers before they are packaged onto other wafers, and only "known-good-dies" are packaged. An advantageous feature of this packaging technology is that the I/O pads on a die can be redistributed to a greater area than the die itself, and hence the number of I/O pads packed on the surfaces of the dies can be increased.

Currently, the packages are tested using probe cards, which have probe pins that may contact the contact pads (or metal bumps, solder balls, etc.) of the devices-under-test (DUTs). The testing of the fan-out WLCSPs, however, faces challenges. For example, the fan-out WLCSPs are prone to warpage due to elevated temperatures. The warpage in the package may cause good packages being misjudged as bad package since some of the solder balls of the DUTs may not be able to be in contact with some of the probe pins during the probing. To avoid such a problem, an excess force may be applied to press the probe cards against the DUTs in order to ensure the contact between the probe cards and the DUTs. This, however, may result in the package and the probe cards being damaged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
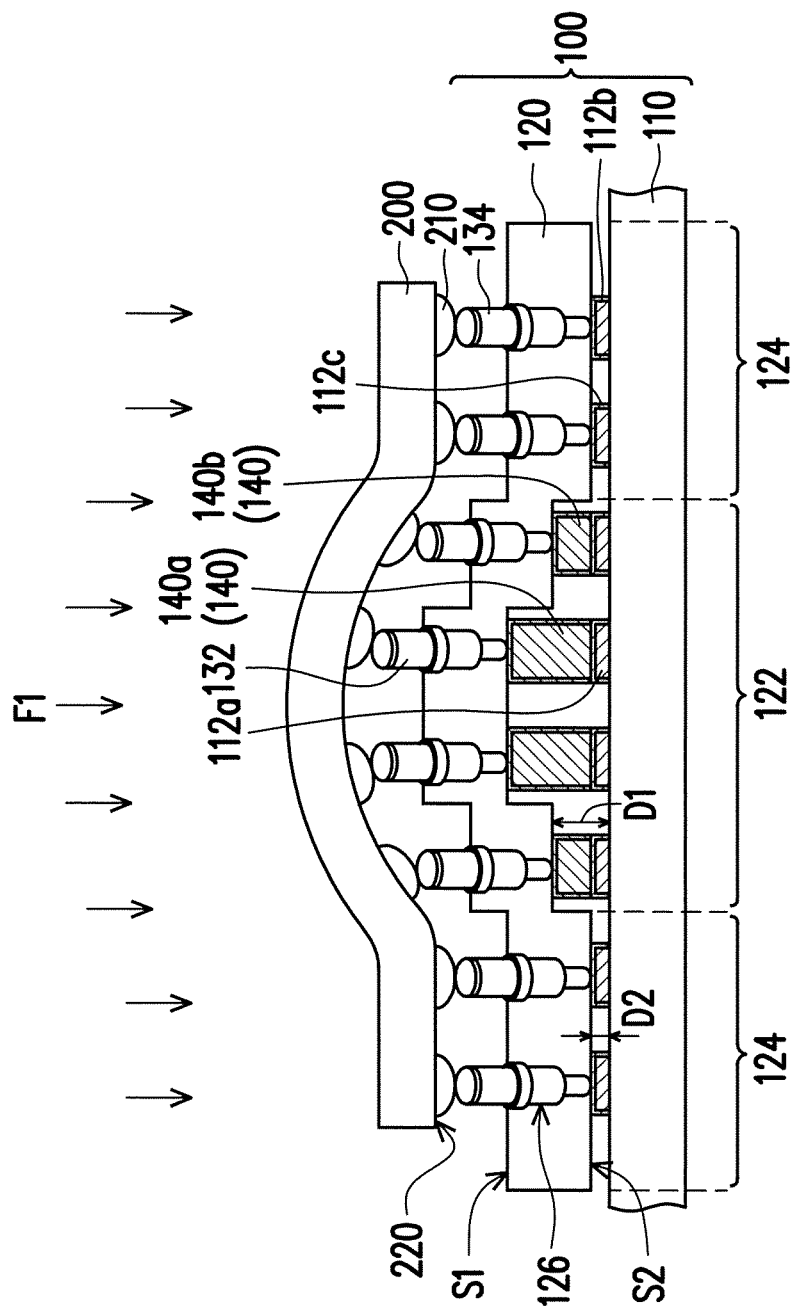
FIG. 1 illustrates a cross-sectional view of a testing apparatus testing an integrated circuit package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
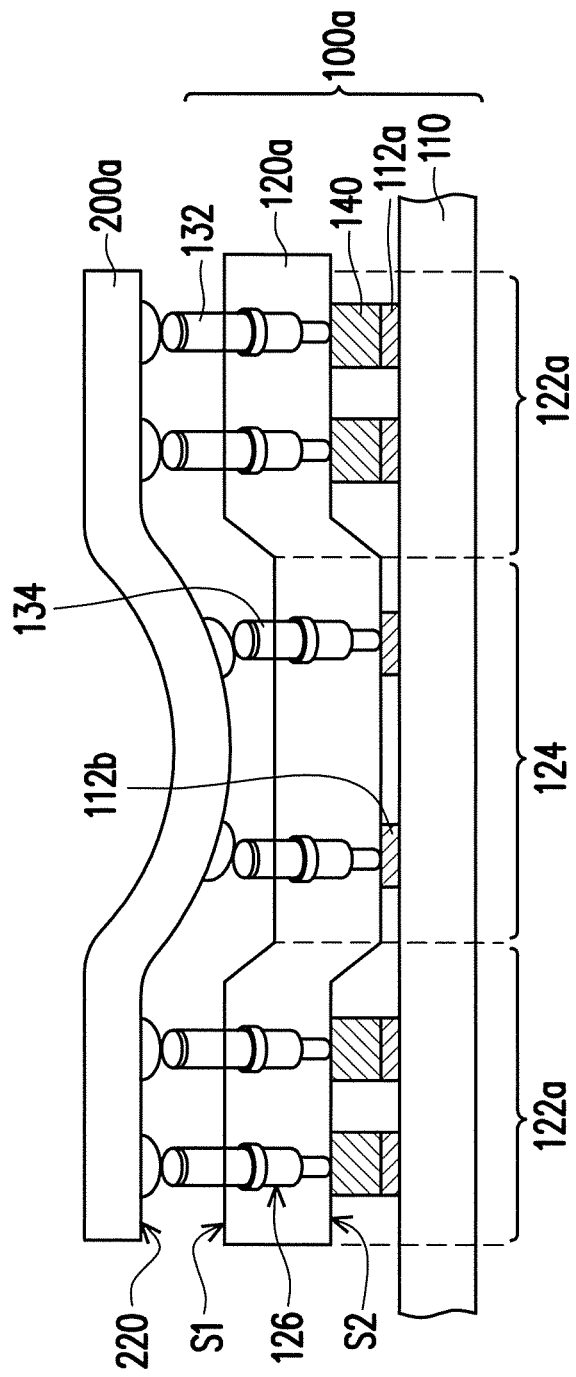
FIG. 2 illustrates a cross-sectional view of a testing apparatus testing an integrated circuit package in accordance with some embodiments.

FIG. 1 illustrates a cross-sectional view of a testing apparatus testing an integrated circuit package in accordance with some embodiments. Referring to FIG. 1, in some embodiments, a testing apparatus 100 as shown in FIG. 2 is configured for testing an integrated circuit package 200. In some embodiments, the testing apparatus 100 is configured to perform a final test (FT) or a system level test (SLT) on the integrated circuit package 200, but the disclosure is not limited thereto. The integrated circuit package 200 has a plurality of electrical terminals 210 disposed on a contact surface 220 of the integrated circuit package 200. In some embodiments, the integrated circuit package 200 includes a large-sized three-dimensional integrated circuit (3D IC) package. For example, the integrated circuit package 200 may be a large-sized Integrated Fan-Out (InFO) package or a Chip on Wafer on Substrate (CoWoS) package. In some embodiments, a size of the integrated circuit package 200 may be over 50 mm×50 mm. For example, the size of the integrated circuit package 200 may be 67.5 mm×67.5 mm for an InFO package, and may be 66 mm×66 mm for a CoWoS package, but, of course, the disclosure is not limited thereto. Such integrated circuit package 200 is prone to warpage under elevated temperatures due to different coefficients of thermal expansions (CTEs) between different materials. As a result, the contact surface 220 of the integrated circuit package 200 is not a flat surface but may be a curvy surface or any forms of uneven surfaces. In some embodiments, a displacement of the warpage of the integrated circuit package 200 could be over 100 μm. For example, the displacement of the warpage of the integrated circuit package 200 is about 280 μm, but, of course, the disclosure is not limited thereto.

In some embodiments, for performing the test by the testing apparatus 100, a profile of the integrated circuit package 200 is firstly evaluated. The profile of the integrated circuit package 200 may be evaluated by, for example, an optical inspector, which provides optical inspection of integrated circuit packages, so as to obtain 2D and 3D measurements and determine package quality for a wide range of device types and sizes. The profile of the integrated circuit package 200 may be obtained by evaluating the package Z-height measurement with any suitable 3D metrology devices.

Then, the testing apparatus 100 is provided according to the profile of the integrated circuit package 200, which is obtained from the evaluation described above. In some embodiments, the testing apparatus 100 includes a base 110, a socket 120, a plurality of conductive pins 132, 134, a plurality of conductive pillars 140. The base 110 includes a plurality of electrical contacts 112a, 112b. The socket 120 is disposed on the base 110 and includes a plurality of through holes 126 distributed in the socket 120. The through holes 126 may be evenly distributed in the socket 120. The profile of the socket 120 is corresponding to the profile of the integrated circuit package 200. The conductive pins 132, 134 are movably disposed in the through holes 126 respectively and electrically connected to the electrical contacts 112a, 112b. In some embodiments, a passivation layer 112c may be formed on a top surface of each of the electrical contacts 112a, 112b and a top surface of each of the conductive pillars 140. In some embodiments, the passivation layer 112c is formed by, for example, an electroless plating process and includes Aurum (Au) or any other suitable material. The passivation layer 112c is configured to prevent the electrical contacts 112a, 112b and the conductive pillars 140 from oxidizing under high temperature caused by high electric current.

In some embodiments, each of the conductive pins 132, 134 is in temporary electrical connections with one of the electrical terminals 210 for the testing apparatus 100 to perform tests on the integrated circuit package 200 as shown in FIG. 1. In some embodiments, the testing apparatus 100 are configured and implemented for the electrical testing of the integrated circuit package 200, so electrical currents or voltages can be applied to the electrical contacts 112a, 112b. Accordingly, in some embodiments, the conductive pins 132, 134 include a plurality of pogo pins for establishing electrical connections between the electrical contacts 112a, 112b of the base 110 and the electrical terminals 210 of the integrated circuit package 200.

In some embodiments, the socket 120 is attached onto the base 110. In an embodiment, the socket 120 is secured on the base 110 through screws, although other mechanisms such as clamps can also be used. The base 110 may further be secured onto a printed circuit board, for example, by screwing a frame (using screws) of the base onto the printed circuit board (not shown). In some embodiments, the conductive pins 132, 134 include a plurality of signal pins and at least one ground pin(s) that are used for probing the integrated circuit package 200. In addition, the conductive pins 132, 134 further include a plurality of power pins, which may have the same structure as the signal pins or the ground pin(s). The conductive pins 132, 134 are electrically coupled to a plurality of metal pads/bumps on the printed circuit board, and the metal pads/bumps are further connected to a tester (not shown). The base 110 may include active and/or passive devices (not shown in FIG. 1). As one of ordinary skill in the art will recognize, a wide variety of devices such as controllers, processors, transistors, capacitors, resistors, or any combinations thereof, and the like can be used to generate the structural and functional requirements of the design for the testing apparatus 100. The devices can be formed using any suitable methods, and may be embedded in the base 110 or mounted on the base 110 by a surface-mount technique. The disclosure is not limited thereto.

In some embodiments, the profile of the socket 120 is corresponding to the profile of the integrated circuit package 200. In one of the implementations, a profile of an upper surface S1 of the socket 120 is corresponding to a profile of the contact surface 220 of the integrated circuit package 200 as shown in FIG. 1. Herein, the so-celled "corresponding to" indicates that the profile of the upper surface S1 substantially matches the profile of the contact surface 220 to a degree that the conductive pins 132, 134 of the testing apparatus 100 is capable of forming stable contact with electrical terminals 210 of the integrated circuit package 200 during the electrical test. In some embodiments, for performing the electrical test, a force F1 is applied uniformly to the integrated circuit package 200 to press the integrated circuit package 200 downward against the testing apparatus 100 for ensuring the electrical terminals 210 are in stable contact with the conductive pins 132, 134. Therefore, the profile of the upper surface S1 of the socket 120 is configured to be corresponding to the profile of the contact surface 220 of the integrated circuit package 200 to a degree that the conductive pins 132, 134 is capable of forming stable contact with electrical terminals 210 under the force F1.

In some implementations, the socket 120 includes at least one first portion 122 and at least one second portion 124, wherein a shortest distance D1 between the first portion 122 and the base 110 is substantially greater than a shortest distance D2 between the second portion 124 and the base 110. In addition, the profile of the upper surface S1 of the socket 120 is substantially conformal to the profile of the lower surface S2 of the socket 120. In other words, the socket 120 has uniform thickness so the profile of the upper surface S1 substantially matches the profile of the lower surface S2. Accordingly, the profile of the upper surface S1 of the socket 120 can substantially match the profile of the contact surface 220 of the integrated circuit package 200. The through holes 126 are distributed all over the socket, including both the first portion 122 and the second portion 124.

In some embodiments, the first portion 122 is a bended portion 122 bended away from the base 110, and the second portion 124 is a portion 124 of the socket 120 other than the bended portion 122. In the embodiment of FIG. 1, the integrated circuit package 200 is warped in an arched form. Accordingly, the bended portion 122 is arch over the base 110. In some embodiments, the bended portion 122 is arch over the base 110 in a stepped form as shown in FIG. 1; however, in other embodiments, the bended portion 122 is also arched over the base 110 in a curvy form. The disclosure does not limit the numbers, the forms and the arrangements of the first portion 122 and the second portion 124 on the socket 120 as long as the profile of the socket 120 is substantially corresponding to the profile of the integrated circuit package 200. In some embodiments, the first portion 122 is the portion corresponding to the warpage portion or the higher portion of the integrated circuit package 200, and the second portion 124 is the portion corresponding to the substantially planar portion or the lowest portion of the integrated circuit package 200, but the disclosure is not limited thereto.

In some embodiments, the conductive pins 132, 134 are movably disposed in the through holes 126 respectively and electrically connected to the electrical contacts 112a, 112b. As shown in FIG. 1, a tip of each of the conductive pins 132, 134 protrudes from an upper surface of the socket 120 for forming temporary electrical connections with one of the electrical terminals 210 of the integrated circuit package 200. The conductive pillars 140 are disposed on the base 110 and connected to the first portion 122 of the socket 120. Each of the conductive pillars 140 is configured to electrically connect one of the conductive pins 132/134 and one of the electrical contacts 112a/112b. In other words, the conductive pillars 140 are connected between the base 110 and the socket 120 for forming electrical connection between the base 110 and the socket 120. In some embodiments, the dimension of the each of the conductive pillars 140 may be greater than, for example, 450 µm, so as to increase the tolerance for the conductive pins 132, 134.

In some embodiments, the electrical contacts 112a, 112b include a plurality of first electrical contacts 112a corresponding to the first portion 122 and a plurality of second electrical contacts 112b corresponding to the second portion 124. In addition, the conductive pins 132, 134 include a plurality of first conductive pins 132 movably disposed in the through holes 126 located on the first portion 122 and a plurality of second conductive pins 134 movably disposed in the through holes 126 located on the second portion 124. With such arrangement, the conductive pillars 140 are disposed on the first electrical contacts 112a and in contact with the first conductive pins 132. The second conductive pins 134 are in contact with the second electrical contacts 112b. In other words, with the arrangement of the first portion 122 and the second portion 124 on the socket 120, a gap would exist between the first portion 122 and the base 110, and the conductive pillars 140 are configured to be disposed in the gap to electrically connect the first conductive pins 132 and the first electrical contacts 112a. Accordingly, in some embodiments, the first conductive pins 132 are electrically connected to the first electrical contacts 112a by the conductive pillars 140, and the second conductive pins 134 are electrically connected to the second electrical contacts 112b by directly contacting the second electrical contacts 112b.

Figure 3:
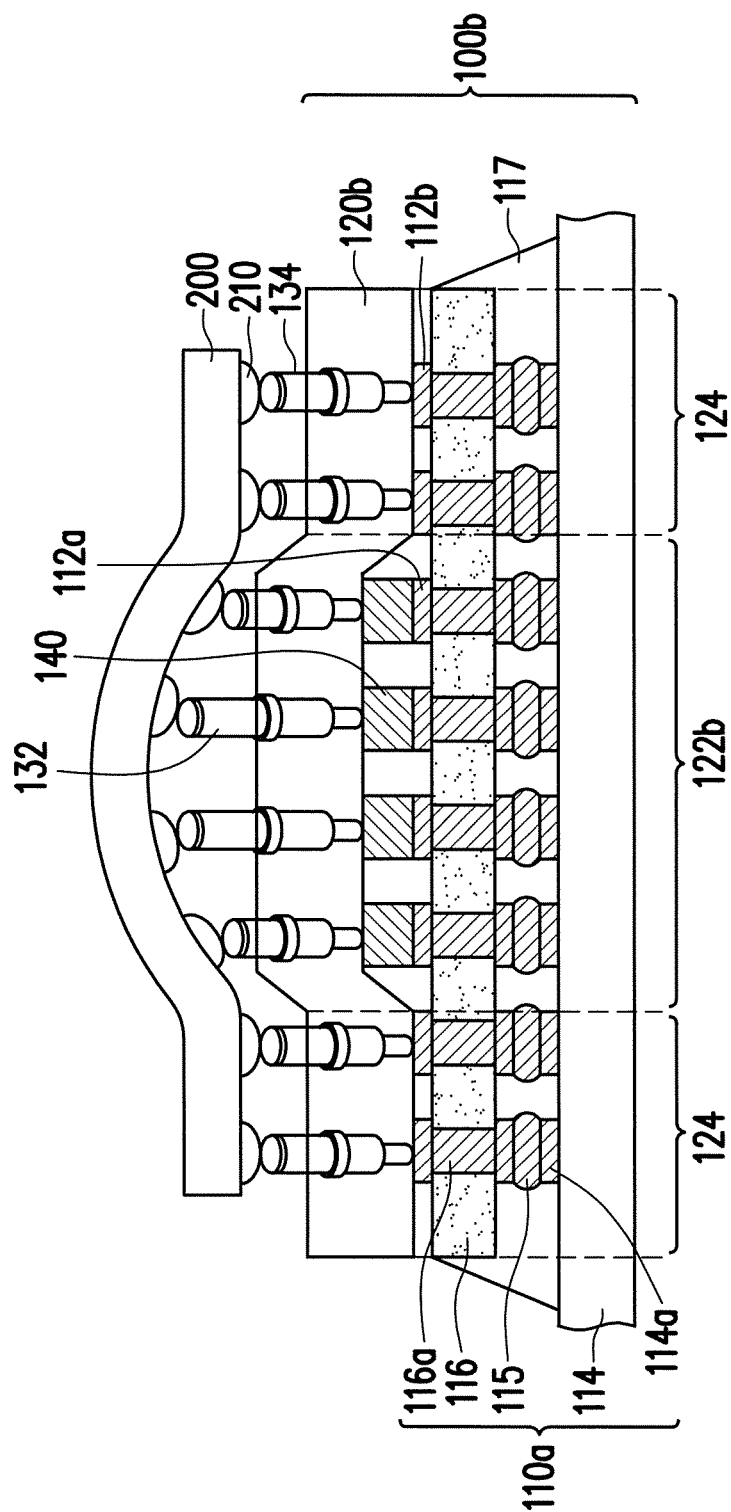
FIG. 3 illustrates a cross-sectional view of a testing apparatus testing an integrated circuit package in accordance with some embodiments.

In some embodiments, a height of one of the conductive pillars 140, e.g. the conductive pillars 140a in FIG. 1, is different from a height of another one of the conductive pillars 140, e.g. the conductive pillars 140b in FIG. 1. However, in other embodiments, the heights of the conductive pillars 140 are substantially the same as shown in the embodiments of FIG. 2 and FIG. 3. In some embodiments, the height of each of the conductive pillars 140 substantially ranges from 50 µm to 5000 µm according to the size and the profile of the integrated circuit package 200. The height range of the conductive pillars 140 indicates that the testing apparatus 100 is most effective to be applied to the integrated circuit package 200 with warpage displacement substantially ranges from 50 µm to 5000 µm. Certainly, the numerical range may differ as technology evolves. The disclosure does not limit the height or the shape of the conductive pillars 140 and the number of the conductive pillars 140 may be corresponding to the numbers of the first conductive pins 132 and the first electrical contacts 112a.

FIG. 2 illustrates a cross-sectional view of a testing apparatus testing an integrated circuit package in accordance with some embodiments. It is noted that the testing apparatus 100a shown in FIG. 2 contains many features same as or similar to the testing apparatus disclosed earlier with FIG. 1. For purpose of clarity and simplicity, detail description of same or similar features may be omitted, and the same or similar reference numbers denote the same or like components. The main differences between the testing apparatus 100a shown in FIG. 2 and the testing apparatus shown in FIG. 1 are described as follows.

In the embodiment of FIG. 2, the integrated circuit package 200a is warped in a valley form. In other way of speaking, the integrated circuit package 200a is warped in a form with multiple ridges (arches). Accordingly, the socket 120a includes a plurality of first portions 122a and at least one second portion 124 correspondingly. In some embodiments, each of the first portions 122a is a bended portion 122a bended away from the base 110 as shown in FIG. 2. In some embodiments, each of the first portions 122a is bended away from the base 110 in a curvy form. Yet in other embodiments, each of the first portions 122a is arched over the base 110 in a stepped form. The disclosure does not limit the numbers, the forms and the arrangements of the first portion 122a and the second portion 124 as long as the profile of the socket 120a is substantially corresponding to the profile of the integrated circuit package 200a. It is noted that the socket 120a includes multiple first portions 122a and multiple second portion 124. The profile and the form of the first portions 122a may be the same or different from one another. Similarly, the profile and the form of the second portions 124 may be the same or different from one another. In the embodiment of FIG. 2, the second portion 124 is the portion corresponding to the warpage portion or the lowest portion of the integrated circuit package 200a. Accordingly, the first portions 122a are the portions corresponding to the substantially planar portion or the higher portion of the integrated circuit package 200a, but the disclosure is not limited thereto.

In some embodiments, the electrical contacts 112a, 112b include a plurality of first electrical contacts 112a corresponding to the first portions 122a and a plurality of second electrical contacts 112b corresponding to the second portion 124. In addition, the conductive pins 132, 134 include a plurality of first conductive pins 132 movably disposed in the through holes 126 located on the first portions 122a and a plurality of second conductive pins 134 movably disposed in the through holes 126 located on the second portion 124. With such arrangement, the conductive pillars 140 are disposed on the first electrical contacts 112a and in contact with the first conductive pins 132. The second conductive pins 134 are in contact with the second electrical contacts 112b. In other words, with the arrangement of the first portions 122a and the second portion 124, a plurality of gaps would exist between the first portions 122a and the base 110, and the conductive pillars 140 are configured to be disposed in the gaps to electrically connect the first conductive pins 132 and the first electrical contacts 112a. Accordingly, in some embodiments, the first conductive pins 132 are electrically connected to the first electrical contacts 112a by the conductive pillars 140, and the second conductive pins 134 are electrically connected to the second electrical contacts 112b by directly contacting the second electrical contacts 112b.

In some embodiments, the height of one of the conductive pillars 140 is substantially the same as shown in FIG. 2. However, in other embodiments, a height of one of the conductive pillars 140 may be different from a height of another one of the conductive pillars 140. The disclosure does not limit the heights or the shapes of the conductive pillars 140, and the number of the conductive pillars 140 may be corresponding to the numbers of the first conductive pins 132 and the first electrical contacts 112a.

FIG. 3 illustrates a cross-sectional view of a testing apparatus testing an integrated circuit package in accordance with some embodiments. It is noted that the testing apparatus 100b shown in FIG. 3 contains many features same as or similar to the testing apparatus 100 disclosed earlier with FIG. 1. For purpose of clarity and simplicity, detail description of same or similar features may be omitted, and the same or similar reference numbers denote the same or like components. The main differences between the testing apparatus 100b shown in FIG. 3 and the testing apparatus 100 shown in FIG. 1 are described as follows.

In some embodiments, the base 110a includes a load board 114 and an interposer 116. The load board 114 has a plurality of board contacts 114a. The interposer 116 is mounted on the load board 114. The electrical contacts 112a, 112b described above are disposed on the interposer 116 and electrically connected to the board contacts 114a. The interposer 116 further includes a plurality of through vias 116a extending through the interposer 116 and electrically connected to the electrical contacts 112a, 112b. In some embodiment, the interposer 116 is configured to redistribute the board contacts 114a of the load board 114. In some embodiments, the base 110a further includes a plurality of conductive joints 115 and an underfill 117. The conductive joints 115 may be disposed between the load board 114 and the interposer 116. The conductive joints 115 are configured to electrically connect the through vias 116a and the load contacts114a. In some embodiments, the conductive joints 115 are a plurality of solder joints disposed on the board contacts 114a. The interposer 116 having the through vias 116a is mounted on the load board 114 and is electrically connected to the board contacts 114a through the conductive joints 115. The underfill 117 is filled between the load board 114 and the interposer 116 and encapsulates the conductive joints 115. In some embodiments, the underfill 117 is reworkable, such that the interposer 116 or other components of the base 110a can be repaired, substituted or replaced. Accordingly, the flexibility in application of the testing apparatus 100b is enhanced. Moreover, the testing apparatus 100b is easy to maintain and suitable for mass production.

In addition, in the embodiment of FIG. 3, the integrated circuit package 200 is warped in an arch form, and the socket 120b includes at least one first portion 122b and a plurality of second portions 124 correspondingly. In some embodiments, each of the first portions 122b is a bended portion 122b bended away from the base 110. In some embodiments, the first portion 122b is bended away from the base 110 in a form that includes tilted planar surfaces and a flat top surface as shown in FIG. 3. Yet in other embodiments, the first portion 122b is bended in a stepped form as shown in FIG. 1 or bended in a curvy from with curvy surfaces. The disclosure does not limit the numbers, the forms and the arrangements of the first portion 122b and the second portion 124 as long as the profile of the socket 120b is substantially corresponding to the profile of the integrated circuit package 200. It is noted that the socket 120b includes multiple first portions 122b and multiple second portions 124 to substantially conform to the profile of the integrated circuit package 200. The profiles and the forms of the first portions 122b and the second portion 124 may be the same or different from one another. In the embodiment of FIG. 3, the first portion 122b is the portion corresponding to the warpage portion or the higher portion of the integrated circuit package 200. Accordingly, the second portions 124 are the portions corresponding to the substantially planar portion or the lowest portion of the integrated circuit package 200, but the disclosure is not limited thereto.

Figure 4:
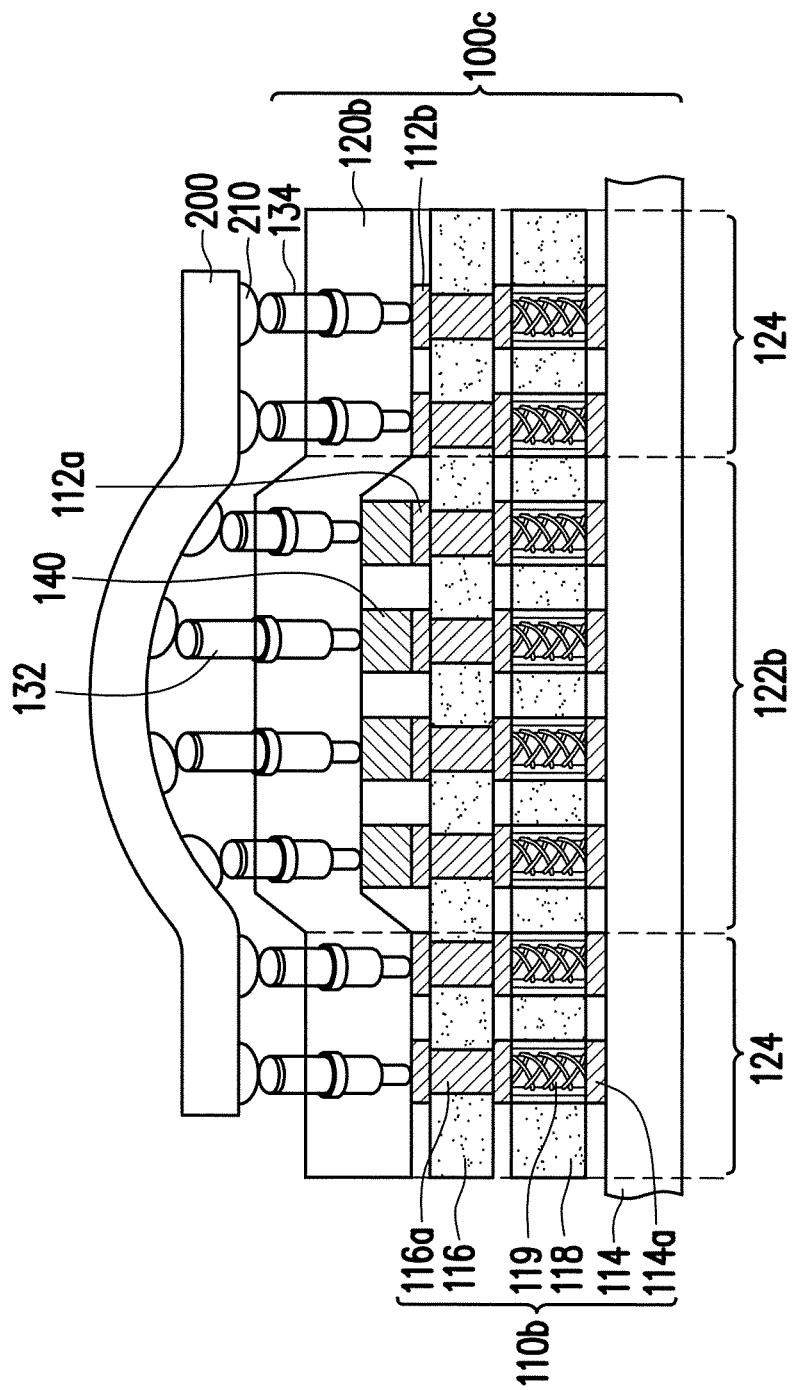
FIG. 4 illustrates a cross-sectional view of a testing apparatus testing an integrated circuit package in accordance with some embodiments.

FIG. 4 illustrates a cross-sectional view of a testing apparatus testing an integrated circuit package in accordance with some embodiments. It is noted that the testing apparatus 100c shown in FIG. 4 contains many features same as or similar to the testing apparatus 100b disclosed earlier with FIG. 3. For purpose of clarity and simplicity, detail description of same or similar features may be omitted, and the same or similar reference numbers denote the same or like components. The main differences between the testing apparatus 100c shown in FIG. 4 and the testing apparatus 100b shown in FIG. 3 are described as follows.

In some embodiments, the base 110b further comprises a buffer substrate 118, which is disposed between the load board 114 and the interposer 116. In some embodiments, the buffer substrate 118 includes a plurality of elastic connectors 119, which extend through (i.e. penetrate) the buffer substrate 118 and electrically connect the through vias 116a of the interposer 116 and the board contacts 114a of the load board 114. In some embodiments, the elastic connectors 119 are configured to provide buffer and elasticity between the load board 114 and the interposer 116 and provide the flexibility to the testing apparatus 100c, so the electrical connection between the testing apparatus 100c and the integrated circuit package 200 can be further enhanced. The load board 114 includes active and/or passive devices (not shown in FIG. 3). As one of ordinary skill in the art will recognize, a wide variety of devices such as controllers, processors, transistors, capacitors, resistors, or any combinations thereof, and the like can be used to generate the structural and functional requirements of the design for the testing apparatus 100b. The devices can be formed using any suitable methods, and may be embedded in the load board 114 or mounted on the load board 114 by a surface-mount technique. The disclosure is not limited thereto.

In addition, the elastic connectors 119 are functioned as a cushion when the force (e.g. the force F1 shown in FIG. 1) is applied to the integrated circuit package 200, so the risk of damaging the integrated circuit package 200 can be further reduced. In one of the implementations, each of the elastic connectors 119 includes a core, conductive wires winding around the core, and a conductive layer covering the conductive wires as shown in FIG. 4. It is noted that the elastic connectors 119 are illustrated in a schematic manner to show the conductive wires underneath the conductive layer. However, forms or implementations of the buffer substrate 118 and the elastic connectors 119 are not limited thereto.

Figure 5:
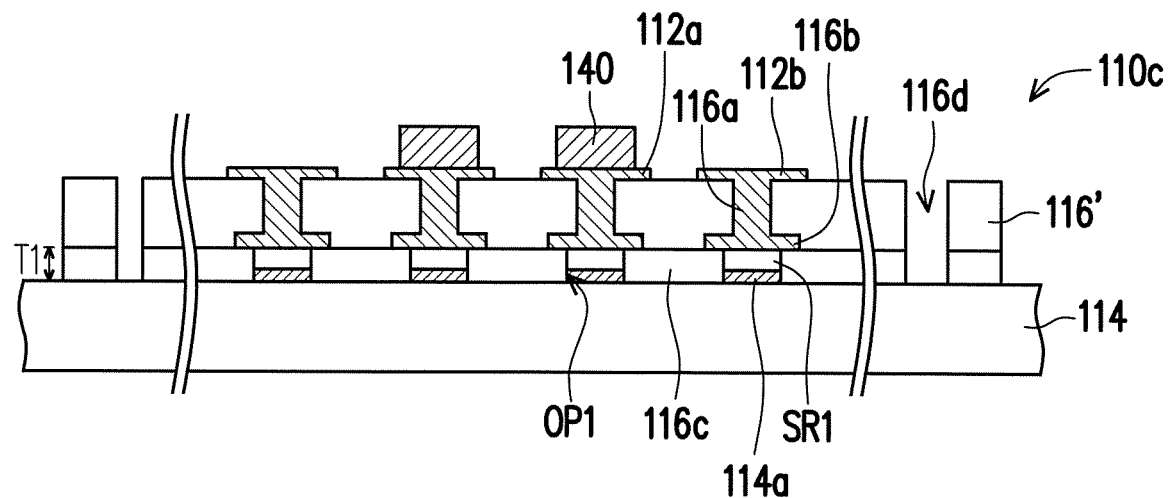
FIG. 5 illustrates a cross-sectional view of a base of a testing apparatus in accordance with some embodiments.

FIG. 5 illustrates a cross-sectional view of a base of a testing apparatus in accordance with some embodiments. Referring to FIG. 5, in some embodiments, the base 110c includes an interposer 116' disposed on the load board 114. The base 110c (e.g. the interposer 116') includes a plurality of locking holes 116d, so the interposer 116' can be secured on load board 114 through a plurality of locking components such as screws or other suitable mechanisms such as clamps, etc. In some embodiments, a space between any two adjacent locking holes 116d may be, for example, about 82 mm.

In some embodiments, the interposer 116' includes a solder resist layer 116c having a plurality of openings OP1, which expose bottom surfaces of the through vias 116a respectively. In some embodiments, a plurality of solder materials SR1 are disposed in the openings OP1 for bonding the through vias 116a to the board contacts 114a. In some embodiments, the size (e.g. diameter) of the openings OP1 may be substantially equal to the size (e.g. diameter) of the board contacts 114a, but the disclosure is not limited thereto. Accordingly, the solder materials SR1 may be filled in the openings OP1 to bond the interposer 116' and the load board 114, so a bottom surface of the interposer 116' is in even contact with a top surface of the load board 114 without a gap exist therebetween. Thereby, bridging of any two adjacent solder materials SR1 can be avoided when the interposer 116' is mounted on the load board 114. In some embodiments, the solder resist layer 116c can be thicker than the thickness of a regular solder resist to further prevent two adjacent solder materials SR1 from bridging. For example, the thickness T1 of the solder resist layer 116c substantially ranges from 5 μm to 5000 μm.

Figure 6:
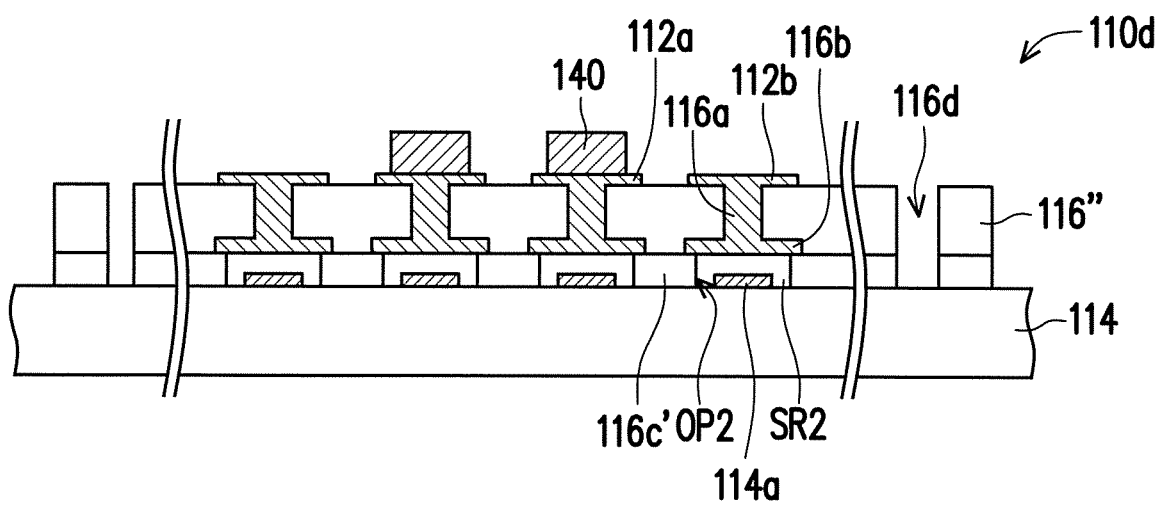
FIG. 6 illustrates a cross-sectional view of a base of a testing apparatus in accordance with some embodiments.

FIG. 6 illustrates a cross-sectional view of a base of a testing apparatus in accordance with some embodiments. It is noted that the base 110d shown in FIG. 6 contains many features same as or similar to the base 110c disclosed earlier with FIG. 5. For purpose of clarity and simplicity, detail description of same or similar features may be omitted, and the same or similar reference numbers denote the same or like components. The main differences between the base 110d shown in FIG. 6 and the base 110c disclosed earlier with FIG. 5 are described as follows.

Referring to FIG. 6, in some embodiments, the base 110d includes an interposer 116" disposed on the load board 114. In some embodiments, the interposer 116" includes a solder resist layer 116c' having a plurality of openings OP2, which expose bottom surfaces of the through vias 116a respectively. In some embodiments, a plurality of solder materials SR2 are disposed in the openings OP2 for bonding the through vias 116a to the board contacts 114a. In some embodiments, the size (e.g. diameter) of the openings OP2 may be substantially greater than the size (e.g. diameter) of the board contacts 114a, but the disclosure is not limited thereto. Accordingly, the solder materials SR2 may be filled in the openings OP2 and covers the board contacts 114a to bond the interposer 116" and the load board 114, so the bottom surface of the interposer 116" is in even contact with the top surface of the load board 114 without a gap exist therebetween. Thereby, bridging of any two adjacent solder materials SR1 can be avoided during the bonding of the interposer 116" and the load board 114.

Figure 7:
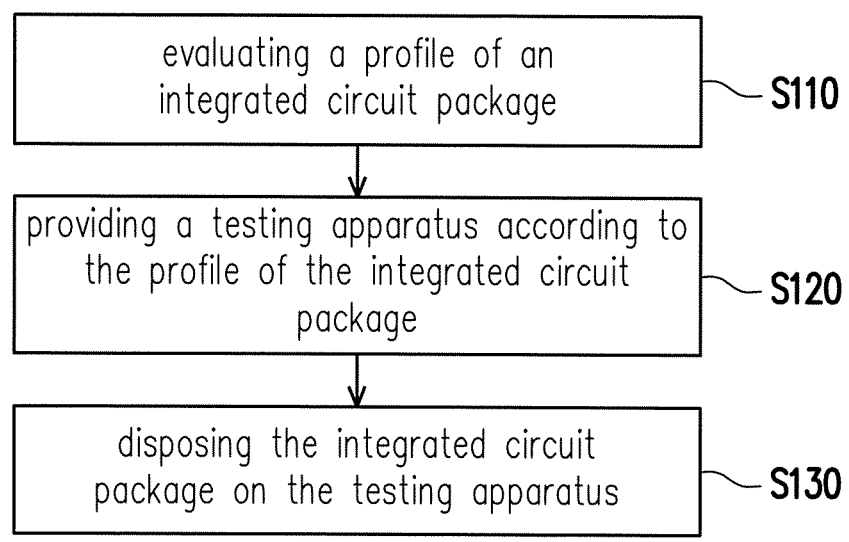
FIG. 7 illustrates a flow chart of a testing method for testing an integrated circuit package in accordance with some embodiments.

FIG. 7 illustrates a flow chart of a testing method for testing an integrated circuit package in accordance with some embodiments. Accordingly, referring to FIG. 7, a testing method for testing an integrated circuit package using the testing apparatuses described above (e.g. the embodiments illustrated in FIG. 1 to FIG. 6) may be described as follows. It is understood additional processes may be provided before, during, and after the testing method shown in FIG. 7, and that some other processes may merely be briefly described herein.

In some embodiments, the testing method may begin with block S110 in which a profile of an integrated circuit package (e.g. the integrated circuit packages 200, 200a, but not limited thereto) is evaluated. The profile of the integrated circuit package is evaluated by, for example, an optical inspector, which provides optical inspection of integrated circuit packages, so as to obtain 2D and 3D measurements and determine package quality for a wide range of device types and sizes. The profile of the integrated circuit package may be obtained by evaluating the package Z-height measurement with any suitable 3D metrology devices.

Then, the method continues with block S120 in which a testing apparatus, e.g. the embodiments illustrated in FIG. 1 to FIG. 6, is provided according to the profile of the integrated circuit package, which is obtained from the evaluation described above. The implementations of the testing apparatus are illustrated in the embodiments of FIG. 1 to FIG. 6. For purpose of clarity and simplicity, detail description of same or similar features may be omitted herein.

Then, the method continues with block S130 in which the integrated circuit package is disposed on the testing apparatus. Thereby, each of the conductive pins of the testing apparatus in temporary electrical connections with one of the electrical terminals of the integrated circuit package, so as to perform tests on the integrated circuit package.

In accordance with some embodiments of the disclosure, a testing apparatus for testing an integrated circuit package having a plurality of electrical terminals is provided, and the testing apparatus includes a base, a socket, a plurality of conductive pins and a plurality of conductive pillars. The base comprises a plurality of electrical contacts. The socket is disposed on the base and comprises a bended portion bended away from the base and a plurality of through holes distributed in the socket. The conductive pins are disposed in the through holes respectively and electrically connected to the electrical contacts, wherein each of the conductive pins protrudes from an upper surface of the socket for forming temporary electrical connections with one of the electrical terminals. The conductive pillars are disposed on the base and connected to the bended portion, wherein each of the conductive pillars electrically connects one of the conductive pins and one of the electrical contacts.

In accordance with some embodiments of the disclosure, a profile of the upper surface of the socket is corresponding to a profile of a contact surface of the integrated circuit package where the electrical terminals are disposed.

In accordance with some embodiments of the disclosure, the electrical contacts comprise a plurality of first electrical contacts corresponding to the bended portion, the conductive pins comprises a plurality of first conductive pins disposed on the bended portion, and the conductive pillars are disposed on the first electrical contacts and in contact with the first conductive pins.

In accordance with some embodiments of the disclosure, the electrical contacts further comprise a plurality of second electrical contacts corresponding to a portion of the socket other than the bended portion, the conductive pins further comprises a plurality of second conductive pins disposed on the portion and contact the second electrical contacts respectively.

In accordance with some embodiments of the disclosure, a height of one of the conductive pillars is different from a height of another one of the conductive pillars.

In accordance with some embodiments of the disclosure, the base further comprises a load board and an interposer. The load board has a plurality of board contacts. The interposer is mounted on the load board and comprising the electrical contacts electrically connected to the board contacts.

In accordance with some embodiments of the disclosure, the base further comprises a plurality of conductive joints and an underfill. The conductive joints are disposed between the load board and the interposer, wherein the interposer further comprises a plurality of through vias extending through the interposer and electrically connected to the electrical contacts, and the conductive joints are configured to electrically connect the through vias and the load contacts. The underfill is filled between the load board and the interposer and encapsulating the conductive joints.

In accordance with some embodiments of the disclosure, the base further comprises a buffer substrate disposed between the load board and the interposer, and the buffer substrate comprises a plurality of elastic connectors extending through the buffer substrate for electrically connecting the through vias and the board contacts.

In accordance with some embodiments of the disclosure, a testing apparatus for testing an integrated circuit package having a plurality of electrical terminals is provided, and the testing apparatus comprises a base, a socket, a plurality of conductive pins and a plurality of conductive pillars. The base comprises a plurality of first electrical contacts and a plurality of second electrical contacts. The socket is disposed on the base and comprises a first portion corresponding to the first electrical contacts, a second portion corresponding to the second electrical contacts and a plurality of through holes distributed in the first portion and the second portion. A shortest distance between the first portion and the base is substantially greater than a shortest distance between the second portion and the base, and a profile of an upper surface of the socket is substantially conformal to a profile of a lower surface of the socket. The conductive pins are disposed in the through holes respectively and electrically connected to the electrical contacts, wherein each of the conductive pins protrudes from the upper surface of the socket for forming temporary electrical connections with one of the electrical terminals. The conductive pillars are disposed on the first electrical contacts and connected to the first portion, wherein each of the conductive pillars electrically connects one of the conductive pins and one of the electrical contacts.

In accordance with some embodiments of the disclosure, the profile of the upper surface is corresponding to a profile of a contact surface of the integrated circuit package where the electrical terminals are disposed.

In accordance with some embodiments of the disclosure, the conductive pins comprises a plurality of first conductive pins disposed on the first portion, and the conductive pillars are in contact with the first conductive pins.

In accordance with some embodiments of the disclosure, the conductive pins further comprises a plurality of second conductive pins disposed on the second portion, and the second electrical contacts are in contact with the second conductive pins respectively.

In accordance with some embodiments of the disclosure, a height of one of the conductive pillars is different from a height of another one of the conductive pillars.

In accordance with some embodiments of the disclosure, the base further comprises a load board and an interposer. The load board has a plurality of board contacts. The interposer is mounted on the load board and comprises the electrical contacts electrically connected to the board contacts.

In accordance with some embodiments of the disclosure, the base further comprises a plurality of conductive joints and an underfill. The conductive joints are disposed between the load board and the interposer, wherein the interposer further comprises a plurality of through vias extending through the interposer and electrically connected to the electrical contacts, and the conductive joints are configured to electrically connect the through vias and the load contacts. The underfill is filled between the load board and the interposer and encapsulating the conductive joints.

In accordance with some embodiments of the disclosure, the base further comprises a buffer substrate disposed between the load board and the interposer, wherein the buffer substrate comprises a plurality of elastic connectors extending through the buffer substrate for electrically connecting the through vias and the board contacts.

In accordance with some embodiments of the disclosure, a testing method for testing an integrated circuit package having a plurality of electrical terminals is provided, and the testing method comprises: evaluating a profile of the integrated circuit package; providing a testing apparatus according to the profile of the integrated circuit package, wherein the testing apparatus comprises a base comprising a plurality of electrical contacts, a socket disposed on the base and comprising a plurality of through holes distributed in the socket, a plurality of conductive pins disposed in the through holes and electrically connected to the electrical contacts, and a plurality of conductive pillars connected between the base and the socket, wherein a profile of the socket is corresponding to the profile of the integrated circuit package; and disposing the integrated circuit package on the testing apparatus, wherein each of the electrical terminals is in temporary electrical connections with one of the conductive pins.

In accordance with some embodiments of the disclosure, the socket comprises a bended portion arched over the base. The electrical contacts comprise a plurality of first electrical contacts corresponding to the bended portion. The conductive pins comprises a plurality of first conductive pins disposed on the bended portion, and the conductive pillars are disposed on the first electrical contacts and in contact with the first conductive pins.

In accordance with some embodiments of the disclosure, the socket comprises a bended portion arched over the base. The electrical contacts further comprise a plurality of second electrical contacts corresponding to a portion of the socket other than the bended portion. The conductive pins further comprises a plurality of second conductive pins disposed on the portion and contact the second electrical contacts respectively.

In accordance with some embodiments of the disclosure, the base further comprises a load board and an interposer. The load board has a plurality of board contacts. The interposer is mounted on the load board and comprises the electrical contacts electrically connected to the board contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing apparatus for testing an integrated circuit package having a plurality of electrical terminals, comprising:

a base comprising a plurality of electrical contacts;
a socket disposed on the base and comprising a bended portion bended away from the base and a plurality of through holes distributed in the socket;
a plurality of conductive pins disposed in the through holes respectively and electrically connected to the electrical contacts, wherein each of the conductive pins protrudes from an upper surface of the socket for forming temporary electrical connections with one of the electrical terminals; and
a plurality of conductive pillars disposed on the base and connected to the bended portion, wherein each of the conductive pillars electrically connects one of the conductive pins and one of the electrical contacts.

2. The testing apparatus as claimed in claim 1, wherein a profile of the upper surface of the socket is corresponding to a profile of a contact surface of the integrated circuit package where the electrical terminals are disposed.

3. The testing apparatus as claimed in claim 1, wherein the electrical contacts comprise a plurality of first electrical contacts corresponding to the bended portion, the conductive pins comprises a plurality of first conductive pins disposed on the bended portion, and the conductive pillars are disposed on the first electrical contacts and in contact with the first conductive pins.

4. The testing apparatus as claimed in claim 3, wherein the electrical contacts further comprise a plurality of second electrical contacts corresponding to a portion of the socket other than the bended portion, the conductive pins further comprise a plurality of second conductive pins disposed on the portion and contact the second electrical contacts respectively.

5. The testing apparatus as claimed in claim 1, wherein a height of one of the conductive pillars is different from a height of another one of the conductive pillars.

6. The testing apparatus as claimed in claim 1, wherein the base further comprises:
a load board having a plurality of board contacts; and
an interposer mounted on the load board and comprising the electrical contacts electrically connected to the board contacts.

7. The testing apparatus as claimed in claim 6, wherein the base further comprises:
a plurality of conductive joints disposed between the load board and the interposer, wherein the interposer further comprises a plurality of through vias extending through the interposer and electrically connected to the electrical contacts, and the conductive joints are configured to electrically connect the through vias and the board contacts; and
an underfill filled between the load board and the interposer and encapsulating the conductive joints.

8. The testing apparatus as claimed in claim 6, wherein the base further comprises a buffer substrate disposed between the load board and the interposer, and the buffer substrate comprises a plurality of elastic connectors extending through the buffer substrate for electrically connecting the through vias and the board contacts.

9. A testing apparatus for testing an integrated circuit package having a plurality of electrical terminals, comprising:
a base comprising a plurality of first electrical contacts and a plurality of second electrical contacts;
a socket disposed on the base and comprising a first portion corresponding to the first electrical contacts, a second portion corresponding to the second electrical contacts and a plurality of through holes distributed in the first portion and the second portion, wherein a shortest distance between the first portion and the base is substantially greater than a shortest distance between the second portion and the base, and a profile of an upper surface of the socket is substantially conformal to a profile of a lower surface of the socket;
a plurality of conductive pins disposed in the through holes respectively and electrically connected to the first electrical contacts and the second electrical contacts, wherein each of the conductive pins protrudes from the upper surface of the socket for forming temporary electrical connections with one of the electrical terminals; and
a plurality of conductive pillars disposed on the first electrical contacts and connected to the first portion, wherein each of the conductive pillars electrically connects one of the conductive pins and one of the first electrical contacts.

10. The testing apparatus as claimed in claim 9, wherein the profile of the upper surface is corresponding to a profile of a contact surface of the integrated circuit package where the electrical terminals are disposed.

11. The testing apparatus as claimed in claim 9, wherein the conductive pins comprise a plurality of first conductive pins disposed on the first portion, and the conductive pillars are in contact with the first conductive pins.

12. The testing apparatus as claimed in claim 11, wherein the conductive pins further comprise a plurality of second conductive pins disposed on the second portion, and the second electrical contacts are in contact with the second conductive pins respectively.

13. The testing apparatus as claimed in claim 9, wherein a height of one of the conductive pillars is different from a height of another one of the conductive pillars.

14. The testing apparatus as claimed in claim 9, wherein the base further comprises:
a load board having a plurality of board contacts; and
an interposer mounted on the load board and comprising the first electrical contacts and the second electrical contacts electrically connected to the board contacts.

15. The testing apparatus as claimed in claim 14, wherein the base further comprises:
a plurality of conductive joints disposed between the load board and the interposer, wherein the interposer further comprises a plurality of through vias extending through the interposer and electrically connected to the first electrical contacts and the second electrical contacts, and the conductive joints are configured to electrically connect the through vias and the board contacts; and
an underfill filled between the load board and the interposer and encapsulating the conductive joints.

16. The testing apparatus as claimed in claim 15, wherein the base further comprises a buffer substrate disposed between the load board and the interposer, wherein the buffer substrate comprises a plurality of elastic connectors extending through the buffer substrate for electrically connecting the through vias and the board contacts.

17. A testing apparatus for testing an integrated circuit package having a plurality of electrical terminals, comprising:
a base comprising a plurality of electrical contacts;
a socket disposed on the base and comprising a first portion and a second portion, the first and second portions of the socket being connected and disposed at different level heights, and the socket comprising a plurality of through holes distributed in the first and second portions of the socket;

a plurality of conductive pins disposed in the through holes respectively and electrically connected to the electrical contacts, wherein each of the conductive pins are temporarily connected to one of the electrical terminals; and a plurality of conductive pillars disposed on the base and connected to one of the first and second portion of the socket, wherein each of the conductive pillars electrically connects one of the conductive pins and one of the electrical contacts.

18. The testing apparatus as claimed in claim 17, wherein the first portion of the socket is spaced apart from the base by a first distance, and the second portion of the socket is spaced apart from the base by a second distance different from the first distance.

19. The testing apparatus as claimed in claim 18, wherein the first portion of the socket is surrounded by the second portion of the socket, and the first distance is greater than the second distance.

20. The testing apparatus as claimed in claim 18, wherein the first portion of the socket is surrounded by the second portion of the socket, and the first distance is less than the second distance.

* * * * *